United States Patent [19]
Yamaguchi

[11] Patent Number: 6,071,788
[45] Date of Patent: Jun. 6, 2000

[54] METHOD OF MANUFACTURING A SEMICONDUCTOR DEVICE WITH A CONDUCTOR FILM HAVING A POLYCRYSTALLINE STRUCTURE

[75] Inventor: Hiromu Yamaguchi, Tokyo, Japan

[73] Assignee: NEC Corporation, Tokyo, Japan

[21] Appl. No.: 09/154,201

[22] Filed: Sep. 16, 1998

[30] Foreign Application Priority Data

Sep. 17, 1997 [JP] Japan ..................... 9-252230

[51] Int. Cl.[7] .................................. H01L 21/20
[52] U.S. Cl. .................. 438/381; 438/240; 438/396; 438/608
[58] Field of Search .................. 438/240, 244, 438/253, 290, 291, 292, 293, 294, 381

[56] References Cited

U.S. PATENT DOCUMENTS

| | | | |
|---|---|---|---|
| 5,619,393 | 4/1997 | Summerfelt et al. | 361/321.1 |
| 5,861,332 | 1/1999 | Yu et al. | 438/240 |
| 5,956,224 | 9/1999 | Jeon | 361/303 |

FOREIGN PATENT DOCUMENTS 7-221197  8/1995  Japan .

OTHER PUBLICATIONS

Lesaicherre, et al., Digest of Technical Papers of 1994, International Electron Devices Meeting, "A Gbit–scale DRAM stacked capacitor technology with ECR MOCVD SrTiO3 and RIE patterned RuO2/TiN storage nodes", pp. 831–834.

Primary Examiner—Brian Dutton
Assistant Examiner—Brook Kebede
Attorney, Agent, or Firm—McGinn & Gibb, P.C.

[57] ABSTRACT

A conductor film is deposited on a semiconductor substrate via an insulation film, and jogs formed on the surface of the conductor film immediately after the deposition are removed by using the chemical mechanical polishing method, the etch back method, or the like. And on the surface of the conductor film thus flattened, a mask member is formed of an inorganic insulation film such as a SOG film or a silicon oxide film deposited by using the chemical vapor deposition method. By dry etching using this mask member as the etching mask, the above described conductor film is processed to have a pattern of a semiconductor wiring layer or a capacitor electrode. As a result, fine processing of the conductor film having a columnar crystal structure is facilitated. In addition, it becomes possible to improve the precision of the electrode shape of the capacitor and implement a highly reliable capacitor.

12 Claims, 7 Drawing Sheets

METHOD OF MANUFACTURING A SEMICONDUCTOR DEVICE WITH A CONDUCTOR FILM HAVING A POLYCRYSTALLINE STRUCTURE

BACKGROUND OF THE INVENTION

1. Field of the Invention

The present invention relates to a method of manufacturing a semiconductor device, and in particular to a method of forming conductor material patterns of capacitor electrodes and so on of semiconductor memory device.

2. Description of the Related Art

As semiconductor memory device permitting arbitrarily inputting and outputting the storage information, there is a DRAM. Each memory cell of this DRAM is formed of one transfer transistor and one capacitor. The DRAM has a simple structure, and is widely used as a device most suited for high integration of the semiconductor memory device.

In the field of the capacitors of such a memory cell, capacitors having a three-dimensional structure have been developed and put into practical use with further high integration of semiconductor devices. The three-dimensional structure of the capacitors is adopted for the following reasons. As semiconductor devices become finer in size and higher in density, it has become indispensable to reduce the area occupied by the capacitors. For ensuring the stable operation and reliability of the DRAM, however, capacitance values equivalent to at least a fixed value are needed. Therefore, it becomes necessary to change the electrode of each capacitor from a planar structure to a three-dimensional structure and thereby expand the surface area of the capacitor electrode within a reduced occupied area.

As the capacitor having a three-dimensional structure in each memory cell of the DRAM, there are a capacitor having a stack structure and a capacitor having a trench structure. Each of these structures has both merits and demerits. The capacitor of the stack structure is highly immune to incidence of alpha rays or noise from a circuit or the like, and operates stably even in the case where the capacitance value is relatively small. Therefore, it is considered that the capacitor of the stack structure is effective even in 4 gigabits for which the design standard of semiconductor devices becomes approximately 0.15 μm.

In the case of the capacitor having the stack structure (hereafter referred to as stack type capacitor), however, a dielectric film (capacitive insulation film) having a very high dielectric constant is needed in order to ensure a predetermined capacitance value in a region having a minute area. As such a capacitive insulation film, materials each having a high dielectric constant such as $SrTiO_3$ (hereafter referred to as STO film), $(Ba, Sr)TiO_3$ (hereafter referred to as BST film), $Pb(Zr, Ti)O_3$ are vigorously investigated. And as a lower electrode of the stack type capacitor, a new conductor material becomes necessary. This aims at ensuring high reliability of the capacitor by a suitable combination of the high dielectric constant material and the lower electrode. For example, as described in DIGEST OF TECHNICAL PAPERS of 1994 INTERNATIONAL ELECTRON DEVICES MEETING, pp. 831 to 834, $SrTiO_3$ is used for the capacitive insulation film, and a conductor material of ruthenium dioxide ($RuO_2$) is used for the lower electrode.

Hereafter, a conventional method for forming the capacitor will be described by referring to the drawing. FIGS. 1A to 1D are sectional views of the capacitor electrode of the above described stack type in the order of production process. FIGS. 2A and 2B are a schematic top view of the stack type capacitor and a sectional view thereof seen along a line I—I, respectively.

Figure 1A:
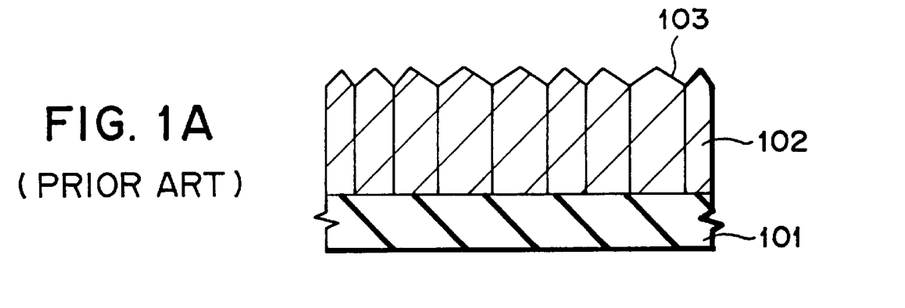
FIGS. 1A to 1D are sectional views showing a conventional manufacturing method in the order of production process.
Figure 2A:
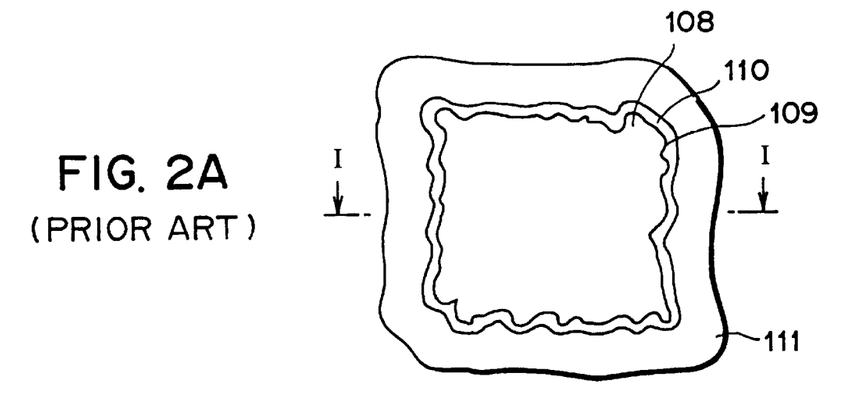
FIGS. 2A and 2B are a top view and a sectional view showing a conventional capacitor, respectively.
Figure 2B:
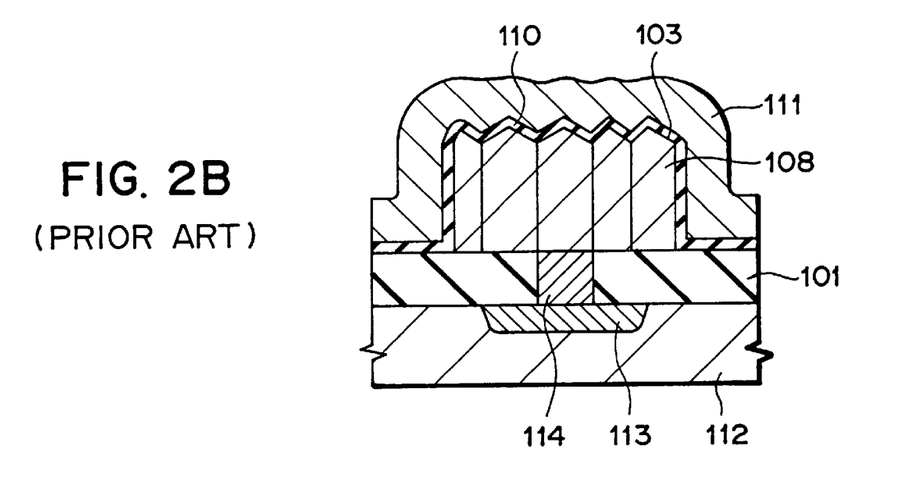

As shown in FIG. 1A, underlying insulation film 101 is formed on a semiconductor substrate such as a silicon substrate. On this underlying insulation film 101, a conductor film 102 made of $RuO_2$ is formed by using the reactive sputtering method. The conductor film 102 is of a polycrystalline structure and has a columnar crystal structure. On the surface of the conductor film 102, therefore, surface jogs 103 of approximately 5 nm are formed.

Figure 1B:
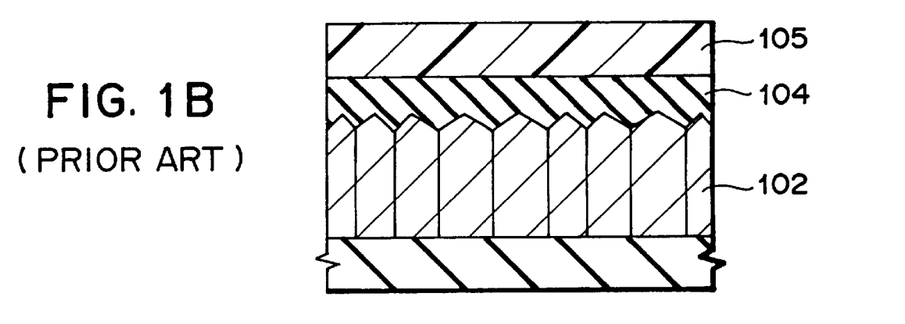

Subsequently, on the conductor film 102 having the surface jogs 103, a SOG (Silicon on Glass) film 104 and a resist film 105 are formed as stacked layers as shown in FIG. 1B. The resist film 105 is patterned by using the photolithography technique. By using a resist film 107 thus patterned (FIG. 1C) as a mask, the SOG film 104 is subjected to dry etching.

Figure 1C:
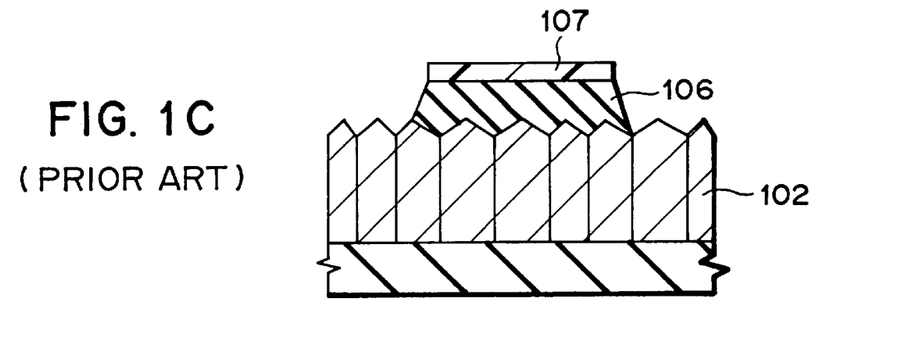

In this way, a SOG film mask 106 is formed as shown in FIG. 1C. On the SOG film mask 106, the resist mask film 107 remains. The SOG film mask 106 has tapered side shapes.

In succession, the conductor film 102 is subjected to dry etching by using the SOG film mask 106 and the resist mask 107 as etching masks. As etching gas, a mixed gas of $O_2$ and $Cl_2$ is used.

Figure 1D:
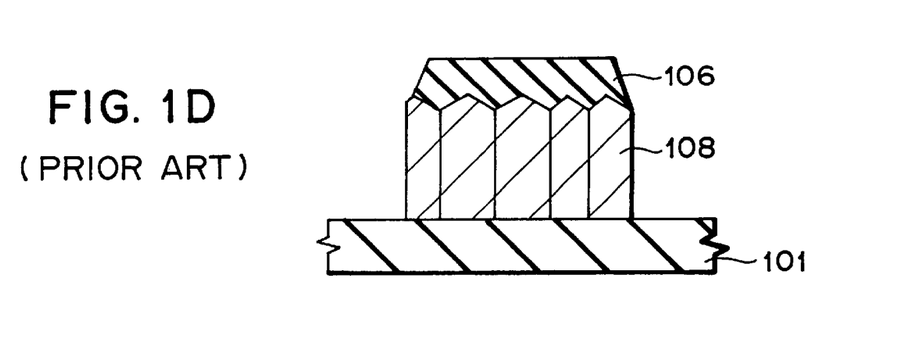

In this way, a lower electrode 108 made of $RuO_2$ is formed on the underlying insulation film 101 as shown in FIG. 1D. Thereafter, the SOG film 106 is removed.

In such a stack type capacitor having the lower electrode 108, a capacitive insulation film 110 is formed on the top face of the lower electrode 108, on the side faces of the electrode 109, and on the underlying insulation film 101 as shown in FIGS. 2A and 2B. This capacitive insulation film 110 is formed of, for example, a BST film or the like. And an upper electrode 111 is formed so as to cover the whole. On a predetermined region of the surface of a semiconductor substrate 112, a diffusion layer 113 is formed. On this semiconductor substrate 112, the above described underlying insulation film 101 is formed. The lower electrode 108 is connected to the diffusion layer 113 by a plug 114 obtained by forming an opening locally through the underlying insulation film 101 and burying a conductive material in this opening.

In the stack type capacitor having the lower electrode 108 made of $RuO_2$, the surface jogs 103 are formed on the top face of the lower electrode 108. In addition, a large number of jogs are formed on electrode side faces 109 of the lower electrode 108 subjected to dry etching. In other words, the pattern shape of the lower electrode 108 is poor.

In the above described conventional technique, the pattern shape of the conductor film such as the lower electrode of the capacitor becomes very bad, and jogs occur in the pattern edge of the conductor film. This is because the conductor film is a polycrystalline film having a columnar structure and consequently jogs are formed on the surface. Because of jogs of the surface of the conductor film, the film thickness of an inorganic insulation film such as the SOG film for etching mask used in the processing of the conductor film becomes great. And the section of the inorganic insulation film mask such as the SOG film mask becomes tapered. In such a shape, the film thickness of the inorganic insulation film mask is made a difference on the pattern edges of the mask by the jogs of the surface of the underlying conductor film. Because of the dry etching of the conductor film using such an inorganic insulation film mask, the pattern shape becomes very bad. The jogs on the pattern edges depend upon the diameter of the polycrystalline particle of the conductor film. In other words, the greater the particle diameter, the greater the jogs. In the above described example of $RuO_2$ of the conventional technique, such jogs amount to approximately 50 nm.

If the lower electrode having such a bad pattern shape is used in a stack type capacitor, the holding characteristic of the information charge stored in the capacitor becomes worse. This will now be described by referring to FIG. 3. In the graph diagram of FIG. 3, its abscissa indicates the leak current per unit area of the capacitor, and its ordinate indicates the accumulative ratio of 1,000 stack type capacitors. Here, the leak current represents a value in the case where 1 V is applied to the capacitor electrode.

Figure 3:
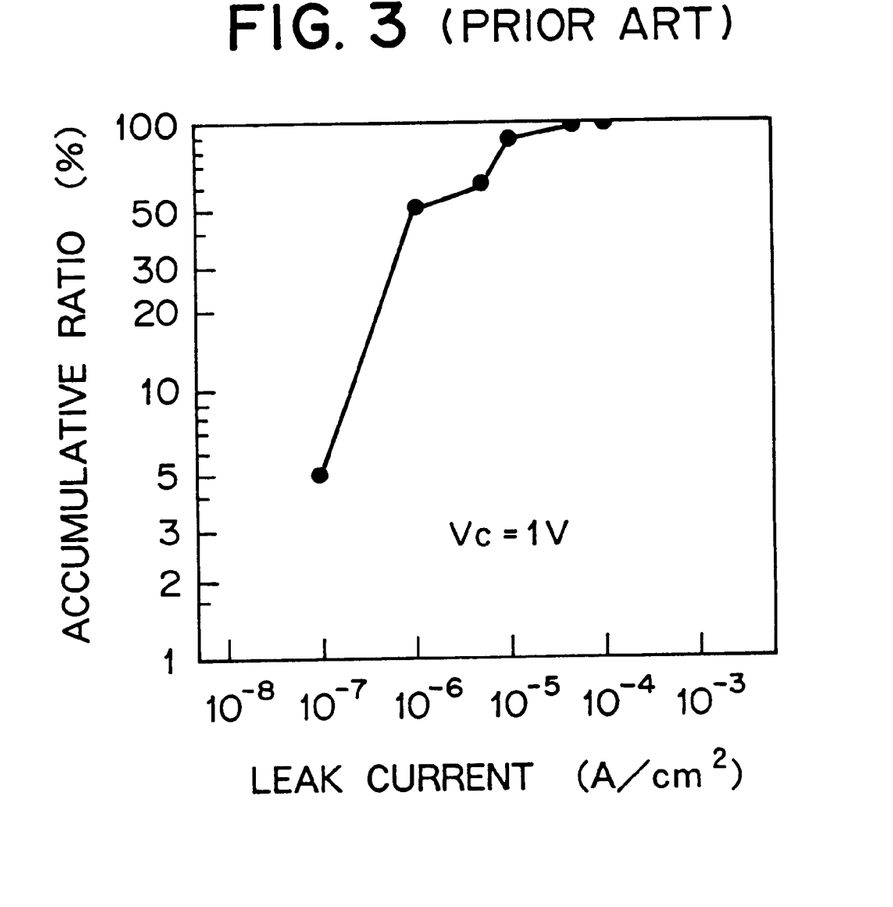
FIG. 3 is a graph diagram illustrating problems of the conventional technique.

As shown in FIG. 3, the ratio of the capacitor for which the leak current value is $10^{-7}$ A/cm$^2$ or the like is approximately 5%. For the leak current of $10^{-6}$ A/cm$^2$, the ratio becomes approximately 50%. And such a capacitor that the leak current becomes approximately $10^{-5}$ A/cm$^2$ is also present. As the leak current thus becomes large, the holding time for storing the information charge decreases. This increase of the leak current of the capacitor is caused by concentration of the electric field on the pattern edge of the lower electrode and the jog portions of the side faces.

In the case of application to wiring and the like, such occurrence of the jogs on the pattern edges and so on of the conductor film makes it difficult to obtain finer wiring.

SUMMARY OF THE INVENTION

An object of the present invention is to facilitate the fine processing of the conductor film having a columnar crystal structure.

Another object of the present invention is to provide a method of manufacturing a semiconductor device capable of improving the precision of the electrode shape of the capacitor and manufacturing highly reliable capacitors.

A method of manufacturing a semiconductor device according to the present invention includes the steps of forming a conductor film on a semiconductor substrate via an insulation film, removing jogs on a surface of the conductor film to flatten the surface, and forming a mask member on the surface of the flattened conductor film and processing the conductor film so as to have a predetermined pattern by using the mask member as an etching mask.

Here, the conductor film has, for example, a polycrystalline structure, and especially a polycrystalline structure of a columnar crystal structure. The conductor film is formed of a single layer film or a stacked layer film of, for example, ruthenium dioxide or ruthenium. Or the conductor film is formed of a single layer film or a stacked layer film of, for example, iridium or iridium oxide. Or the conductor film is formed of a stacked layer film of, for example, a titanium nitride film or a tungsten film.

Furthermore, the removal of the jogs on the surface of the conductor film can be conducted by using a chemical mechanical polishing method or anisotropic dry etching.

Furthermore, the mask member can be formed of a SOG film or a silicon oxide film deposited by using a chemical vapor deposition method.

As described above, the conductor film can be processed so as to have a predetermined pattern and serve as a wiring layer of the semiconductor device, or the conductor film can be processed so as to have a predetermined pattern and serve as a lower electrode of a capacitor of the semiconductor device.

By thus removing the jogs of the surface of the conductor film and flattening the surface, the film thickness of the mask member of an inorganic insulation film, such as a SOG film mask, formed on the surface of the conductor film becomes uniform. And the taper shape of its section is restricted. As a result, the problem of the conventional technique, i.e., the problem that the film thickness of the mask member differs on the pattern edges of the mask member due to the surface jogs of the underlying conductor film is eliminated. Furthermore, by dry etching of the conductor film using the mask member of the uniform inorganic insulation film, the pattern shape is significantly approved.

DESCRIPTION OF THE PREFERRED EMBODIMENTS

Preferred embodiments of the present invention will now be described concretely. FIGS. 4A to 4E are sectional views showing a first embodiment of a semiconductor device manufacturing method according to the present invention in the order of production process. FIGS. 5A and 5B show a stack type capacitor formed by using the present embodiment.

Figure 4A:
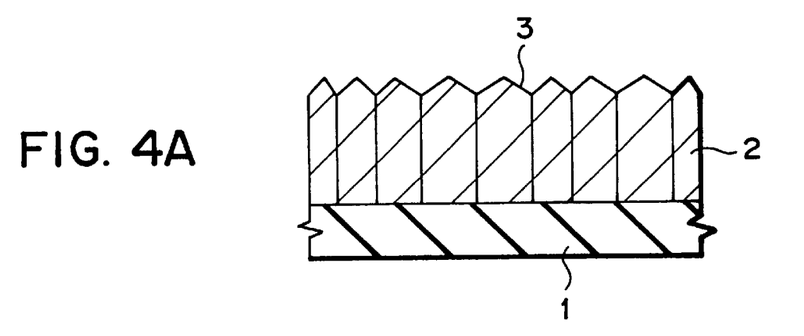
FIGS. 4A to 4E are sectional views showing a first embodiment of a manufacturing method according to the present invention in the order of production process.
Figure 5A:
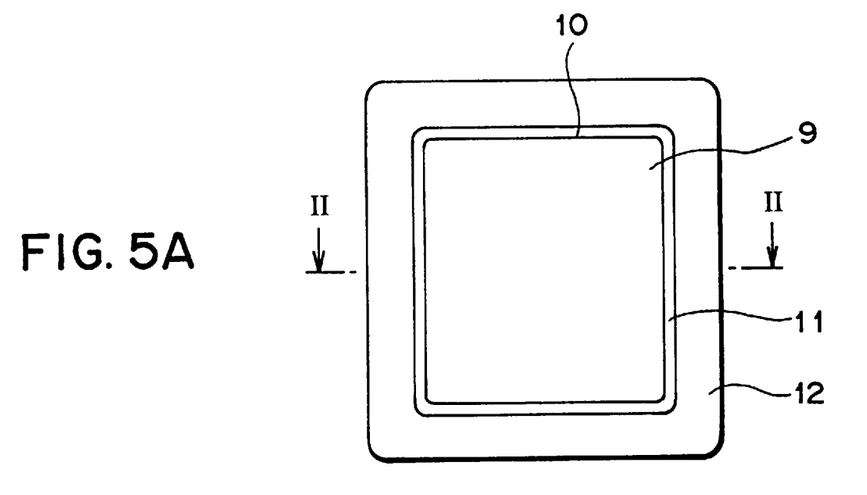
FIGS. 5A and 5B are a top view showing a capacitor formed by using the method of the first embodiment and a sectional view thereof seen along a line II—II, respectively.
Figure 5B:
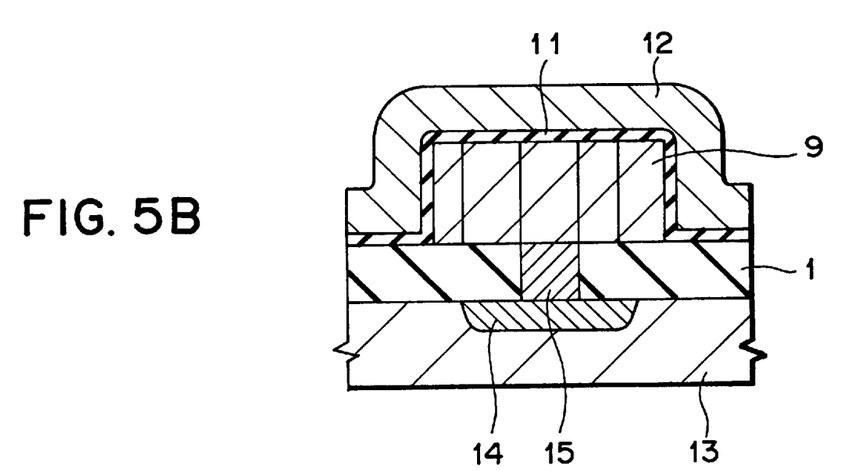

As shown in FIG. 4A, an underlying insulation film 1 is formed on a semiconductor substrate such as a silicon substrate by using a silicon oxide film. On the underlying insulation film 1, a conductor film 2 is formed. This conductor film 2 is, for example, a $RuO_2$ film having a film thickness of approximately 300 nm formed by using the reactive sputtering method. In this reactive sputtering method for forming the $RuO_2$ film, a mixed gas of Ar and $O_2$ for example, can be used, and sputtering is conducted by using a Ru metal as a target. The conductor film 2 thus formed has a polycrystalline structure, and is formed of $RuO_2$ having a columnar crystal structure. On the surface of the conductor film 2, surface jogs 3 of approximately 3 nm are formed.

Figure 4B:
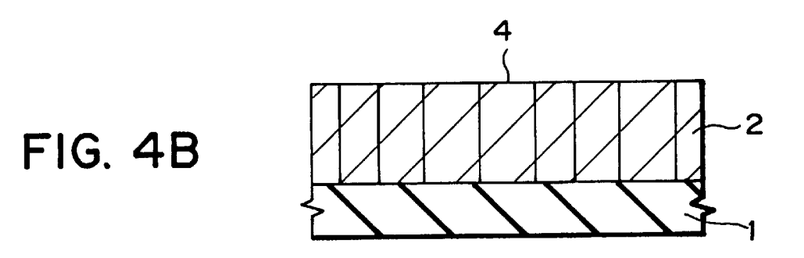

As shown in FIG. 4B, the surface of the conductor film 2 is polished by using a chemical mechanical polishing (CMP) method. Here, alumina ($Al_2O_3$) powder can be used as a polishing material. In this way, the surface jogs 3 on the surface of the conductor film 2 are completely removed, and a flattened surface 4 is formed.

Figure 4C:
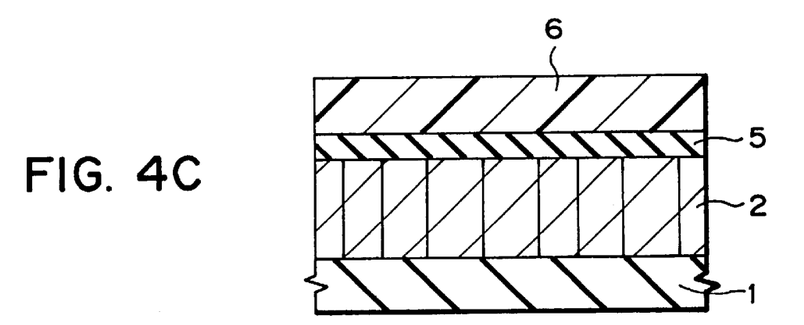

As shown in FIG. 4C, a SOG film 5 and a resist film 6 are formed as stacked layers on the flattened surface 4. The SOG film 5 has a film thickness of, for example, approximately 100 nm. The resist film 6 is patterned by using the photolithography technique, and the SOG film 5 is subjected to dry etching. The dry etching of the SOG film 5 can be conducted in an ordinary RIE (reactive ion etching) system by using $CHF_3$ as the reaction gas.

Figure 4D:
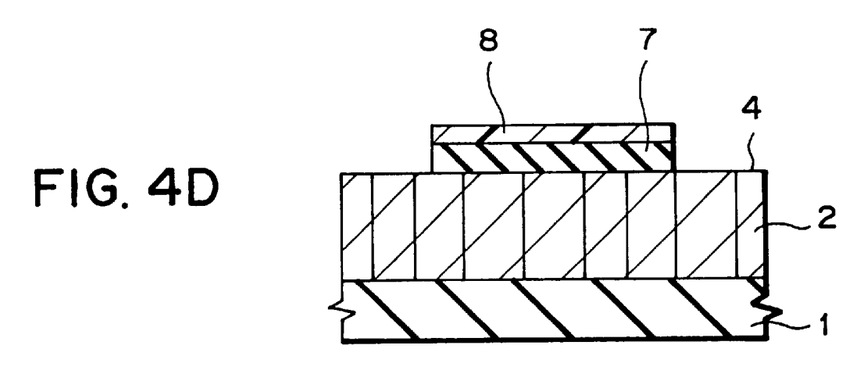

In this way, a SOG film mask 7 is formed on the flattened surface 4 of the conductor film 2 as shown in FIG. 4D. On the SOG film mask 7, a resist mask 8 is left. Unlike the case of the conventional technique, the SOG film mask 7 is perpendicular to the flattened surface 4 of the conductor film 2.

Figure 4E:
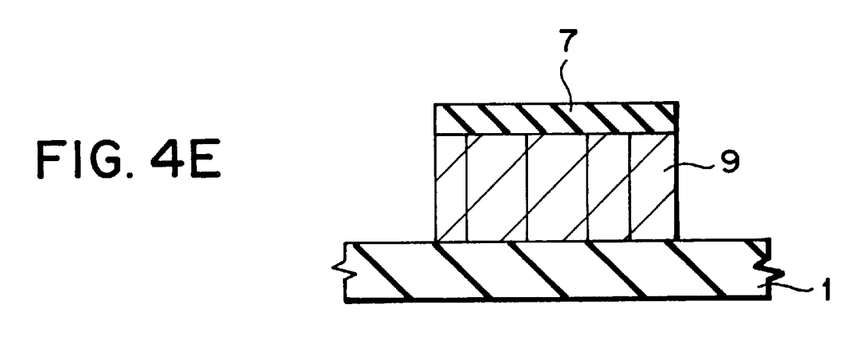

Thereafter, the conductor film 2 is subjected to dry etching by using the SOG film mask 7 or the resist mask 8 as an etching mask as described with reference to the conventional technique. As the etching gas in the RIE process, a mixed gas of $O_2$ and $Cl_2$ can be used. As shown in FIG. 4E, a lower electrode 9 made of $RuO_2$ is thus formed on the underlying insulation film 1. By the way, the SOG film mask 7 is left on the lower electrode 9.

And a stack type capacitor having the lower electrode 9 made of $RuO_2$ is formed as shown in FIGS. 5A and 5B.

With reference to FIG. 5B showing the section structure of such a capacitor, a diffusion layer 14 having an N conduction type is formed in a predetermined region of the surface of a semiconductor substrate 13 having a P conduction type. By forming an opening in a part of the underlying insulation film 1 located on the semiconductor substrate 13 and burying a conductive material in the opening, a plug 15 is formed. This plug 15 is made of polycrystalline silicon containing phosphorus or arsenic impurities. Alternatively, this plug 15 may be made of metal such as tungsten or titanium nitride. By this plug 15, the lower electrode 9 is electrically connected to the diffusion layer 14.

On the flattened top face and side faces of the lower electrode 9, and on the underlying insulation film 1, a capacitive insulation film 11 is then formed. This capacitive insulation film 11 is formed of, for example, a BST film. An upper electrode 12 is then formed so as to cover the whole.

In the case of the present embodiment, any jogs are not formed on the electrode side faces 10 of the lower electrode 9 subjected to the dry etching as shown in FIG. 5A. The present embodiment is excellent in pattern shape of the conductor film.

As described above, jogs are not formed on the side faces 10 of the lower electrode 9. In the stack type capacitor having this lower electrode, the holding characteristic of the information charge stored in the capacitor is significantly improved.

This will now be described by referring to FIG. 6. In the graph diagram of FIG. 6, its abscissa indicates the leak current per unit area of the capacitor, and its ordinate indicates the accumulative ratio of 1,000 stack type capacitors. Here, the leak current represents a value in the case where 1 V is applied to the capacitor electrode.

Figure 6:
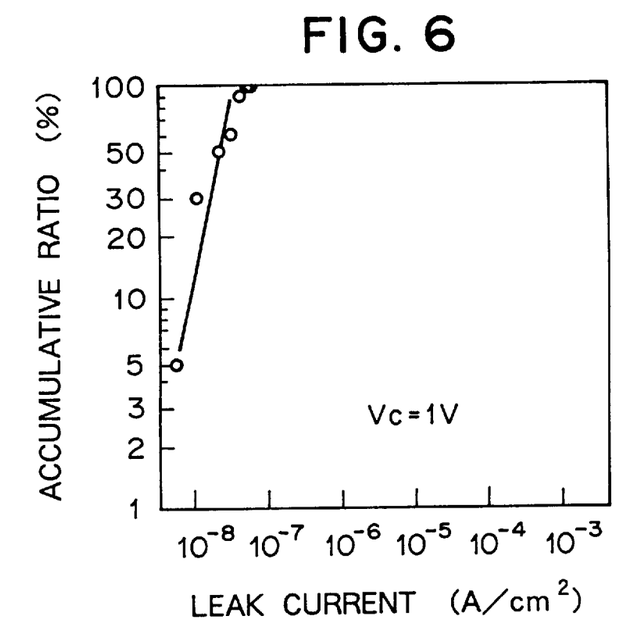
FIG. 6 is a graph diagram illustrating the effect of the first embodiment of the present invention.

In the case of the present invention, the ratio of the capacitor for which the leak current value of the capacitor is $10^{-7}$ A/cm$^2$ or the less becomes approximately 100% as shown in FIG. 6. In other words, all capacitors become good.

A second embodiment of the present invention will now be described. The processes of the present embodiment are almost the same as those of the first embodiment shown in FIGS. 4A to 4E. However, the processes of the present embodiment are different from those of the first embodiment in that the jogs 3 on the surface of the conductor film 2 are removed by an etching back method using the RIE method. In this point, the present embodiment differs largely from the first embodiment. Hereafter, the difference of the present embodiment from the first embodiment will be mainly described.

In the same way as the description of the first embodiment, an underlying insulation film 1 is formed on a semiconductor substrate such as a silicon substrate by using a silicon oxide film as shown in FIG. 4A. On this underlying insulation film 1, a conductor film 2 is formed. The conductor film 2 is, for example, a $RuO_2$ film having a film thickness of approximately 400 nm deposited by using the reactive sputtering method. Furthermore, on the surface of the conductor film 2, surface jogs 3 of approximately 5 nm are formed.

As shown in FIG. 4B, the surface of the conductor film 2 is flattened. In the present embodiment, the surface of the conductor film 2 formed of a $RuO_2$ film is flattened by etching back it by means of anisotropic dry etching using the RIE. As the reaction gas of the RIE, a mixed gas of $Cl_2$ and $O_2$ can be used. By the anisotropic etching using such a reaction gas, the surface of the conductor film is completely flattened and a flattened surface 4 is formed. In this case, the conductor film after the etch back has a film thickness of, for example, approximately 300 nm.

The processes of the conductor film 2 after the process of flattening are the same as those of the first embodiment, and consequently description thereof will be omitted.

In this second embodiment, the in-plane uniformity of the wafer of the conductor film 2 after flattening is more excellent than that of the first embodiment. Whereas in the case of the first embodiment the dispersion of the film thickness of the conductor film becomes approximately 10% for a wafer substrate having a diameter of 8 inch, the dispersion thereof becomes 5% or less in the second embodiment.

Furthermore, if the lower electrode and the stack type capacitor are formed by using the above described method, the holding characteristic of the information charge stored in the capacitor is also improved. This will now be described by referring to FIG. 7. In the graph diagram of FIG. 7, its abscissa indicates the leak current per unit area of the capacitor, and its ordinate indicates the accumulative ratio of 1,000 stack type capacitors in the same way as the first embodiment. The leak current represents a value obtained when 1 V is applied to the capacitor electrode. As the capacitive insulation film in this case, a STO film is used.

Figure 7:
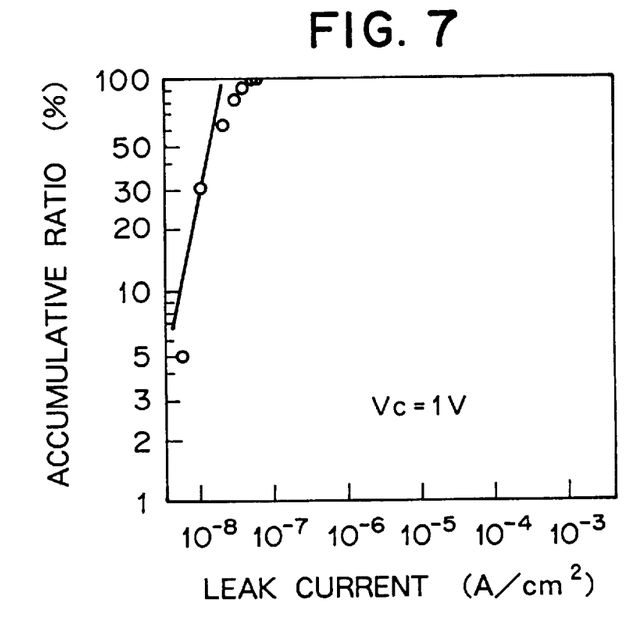
FIG. 7 is a graph diagram illustrating the effect of a second embodiment of the present invention.

In the second embodiment as well, the ratio of the capacitor for which the leak current of the capacitor exhibits a value of $10^{-7}$ A/cm$^2$ becomes approximately 100%. Therefore, all capacitors become good.

For the embodiments heretofore described, the case where the lower electrode of the stack type capacitor is formed of a $RuO_2$ film has been described. The present invention is not limited to such a material. So long as the lower electrode is formed of a conductor film having a polycrystalline structure, the present invention can be applied. For example, for a single layer film of ruthenium (Ru), a $RuO_2$ film/Ru film (stacked layer film obtained by stacking a $RuO_2$ film on a Ru film), a single layer film of Ir, an $IrO_2$ film, or an $IrO_2$ film/Ir film as well, the present invention brings about effects. Furthermore, the present invention can be applied also to stacked layers obtained from a combination of the above described single layer or stacked layers, and a titanium nitride or tungsten film.

For the embodiments, the case where the SOG film is used as the etching mask in the processing of the conductor film using the dry etching has been described. Even if a silicon oxide film deposited by using a chemical vapor deposition (CVD) method is used instead of the SOG film, the effects of the present invention can be obtained.

For the embodiments heretofore described, the case where the present invention is applied to the lower electrode of the stack type capacitor has been described. However, the present invention can be sufficiently applied also to formation of an electrode structure other than this, such as an electrode of wiring or the like.

According to the semiconductor manufacturing method of the present invention, a conductor film is deposited on a semiconductor substrate via an insulation film, and jogs formed on the surface of the conductor film immediately after the deposition are removed by using the chemical mechanical polishing method, the etch back method, or the like, as heretofore described. And on the surface of the conductor film thus flattened, a mask member is formed of an inorganic insulation film such as a SOG film or a silicon oxide film deposited by using the chemical vapor deposition method. By dry etching using this mask member as the etching mask, the above described conductor film is processed to have a pattern of a semiconductor wiring layer or a capacitor electrode. Here, the conductor film is a metal film having a columnar polycrystalline structure of ruthenium dioxide, ruthenium, iridium, or iridium oxide.

In the case of the present invention, therefore, any jogs are not formed on the patterned conductor film after dry etching, such as the wiring layer or edge side faces of the capacitor electrode, and the pattern shape of the conductor film becomes very excellent.

Especially, if the lower electrode of the capacitor is formed as described above, the production yield or the reliability of capacitors is highly improved in the case where the capacitive insulation film of the capacitor is made of a material having a high dielectric constant, such as a STO film or a BST film.

Furthermore, in the case where the present invention is applied to a wiring layer of a semiconductor device, it is highly facilitated to make wiring finer.

In this way, fine processing of a conductor film having a columnar polycrystalline structure is facilitated, and super-integration and a higher density of semiconductor devices are further promoted.

What is claimed is:

1. A method of manufacturing a semiconductor device comprising the steps of:

forming a conductor film on an insulation film formed on a semiconductor substrate;

removing jogs on a surface of said conductor film to flatten the surface; and forming a mask member having a pattern on the surface of said flattened conductor film and etching said conductor film by using said mask member as an etching mask.

2. A semiconductor device manufacturing method according to claim 1, wherein said conductor film has a polycrystalline structure.

3. A semiconductor device manufacturing method according to claim 1, wherein said conductor film has a columnar crystal structure grown nearly perpendicular to the surface of said semiconductor substrate.

4. A semiconductor device manufacturing method according to claim 1, wherein said conductor film is a single layer film of ruthenium dioxide or ruthenium or a stacked layer film including a ruthenium dioxide film and a ruthenium film.

5. A semiconductor device manufacturing method according to claim 1, wherein said conductor film is a single layer film of iridium or iridium oxide or a stacked layer film including an iridium film and an iridium oxide film.

6. A semiconductor device manufacturing method according to claim 4, wherein said conductor film is a stacked layer film including a titanium nitride film and a tungsten film.

7. A semiconductor device manufacturing method according to claim 5, wherein said conductor film is a stacked layer film including a titanium nitride film and a tungsten film.

8. A semiconductor device manufacturing method according to claim 1, wherein the removal of the jogs on the surface of said conductor film is conducted by using a chemical mechanical polishing method.

9. A semiconductor device manufacturing method according to claim 1, wherein the removal of the jogs on the surface of said conductor film is conducted by using anisotropic dry etching.

10. A semiconductor device manufacturing method according to claim 1, wherein said mask member comprises a SOG film or a silicon oxide film deposited by using a chemical vapor deposition method.

11. A semiconductor device manufacturing method according to claim 1, wherein said conductor film is processed so as to have a pattern and serve as a wiring layer of the semiconductor device.

12. A semiconductor device manufacturing method according to claim 1, wherein said conductor film is processed so as to have a pattern and serve as a lower electrode of a capacitor of the semiconductor device.

* * * * *